United States Patent [19]

Ishii et al.

[11] Patent Number: 5,335,203
[45] Date of Patent: Aug. 2, 1994

[54] SEMICONDUCTOR INTEGRATED CIRCUIT DEVICE WITH INTERNAL VOLTAGE DROP CIRCUITS

[75] Inventors: Kyoko Ishii, Tokyo; Shinichi Miyatake, Hamura; Tsutomu Takahashi, Akishima; Shinji Udo, Akishima; Hiroshi Yoshioka, Akishima; Mitsuhiro Takano, Tokorozawa; Makoto Morino, Akishima, all of Japan

[73] Assignees: Hitachi, Ltd., Tokyo; Hitachi VLSI Engineering Corp., Kodaira, both of Japan

[21] Appl. No.: 834,354

[22] Filed: Feb. 12, 1992

[30] Foreign Application Priority Data

Feb. 12, 1991 [JP] Japan .................. 3-040954

[51] Int. Cl.⁵ .............. G11C 11/40; G11C 11/34; H03K 3/01
[52] U.S. Cl. ................ 365/226; 307/296.8; 365/189.09
[58] Field of Search .......... 365/226, 189.09; 307/296.8

[56] References Cited

U.S. PATENT DOCUMENTS 5,179,539 1/1993 Horiguchi et al. .............. 365/226

FOREIGN PATENT DOCUMENTS 63-94499 4/1988 Japan .

Primary Examiner—Eugene R. LaRoche
Assistant Examiner—Viet Q. Nguyen
Attorney, Agent, or Firm—Antonelli, Terry, Stout & Kraus

[57] ABSTRACT

A semiconductor memory device has a plurality of divided memory blocks, each of which has its X-system addresses assigned so that an equal number of word lines in a plurality of sets of memory mats and sense amplifiers may be selected. Each memory block is equipped with a plurality of internal voltage drop circuits for generating a supply voltage from the outside into the operating voltages of the sense amplifiers.

8 Claims, 5 Drawing Sheets

SEMICONDUCTOR INTEGRATED CIRCUIT DEVICE WITH INTERNAL VOLTAGE DROP CIRCUITS

BACKGROUND OF THE INVENTION

The present invention relates to a semiconductor integrated circuit device and, more particularly, to a technology which is effective if used in a dynamic RAM (i.e., Random Access Memory) having a high memory capacity such as about 16 Mbits.

There has been advanced the development of the dynamic RAM having a memory capacity as high as about 16 Mbits. This dynamic RAM is disclosed, for example, on pp. 67 to 81 of "Nikkei Micro Device" issued on Mar. 1, 1988, by NIKKEI McGRAW-HILL.

SUMMARY OF THE INVENTION

In accordance with the aforementioned high memory capacity, the memory chips are necessarily large-sized. Thus, our investigations have revealed that a specific considerations has to be taken into the drop of speed due to the miniaturization of elements and the arrangement of wiring lines. Since the amount of signal decreases with the miniaturization of the memory elements, sense amplifiers for amplifying such fine signals accurately and quickly are required to retain their operational margins. It has also been revealed that a variety of problems such the large signal delays are caused as a result of elongation of the wiring lines between the input pads and the internal circuits for receiving the signals of the input pads. In order to realize the high memory capacity such as about 16 Mbits, more specifically, there is required a novel technical development which is drastically different from the techniques used in the dynamic RAM of about 1 Mbits or 4 Mbits.

An object of the present invention is to provide a semiconductor integrated circuit device which is suited for a semiconductor memory circuit having its memory capacity increased.

Another object of the present invention is to provide a semiconductor integrated circuit device which is equipped with a semiconductor memory circuit having succeeded in realizing a high memory capacity while stabilizing and speeding up the operations.

The foregoing and other objects and novel features of the present invention will become apparent from the following description to be made with reference to the accompanying drawings.

The representatives of the invention to be disclosed herein will be briefly summarized in the following. A semiconductor integrated circuit device is divided into a plurality of memory blocks, each of which has its X-system addresses assigned so that an equal number of word lines of a plurality of memory mats and sense amplifiers may be selected, and a plurality of internal voltage drop circuits are provided for generating the operating voltages of the sense amplifiers in response to a supply voltage from the outside to each memory block. A signal wiring is formed through a shielding conductor layer over gain setting elements disposed in feedback amplifiers for forming the constant voltage for the internal voltage drop. In the vicinity of input pads, there are disposed initial stage circuits and drive circuits for driving the signal lines for guiding the signals corresponding to the input signals fed from the input pads into an internal circuit.

According to the above-specified means, a high current can be prevented from flowing into a specific wiring because each block is not equipped with a power supply. As a result, it is possible to reduce the supply noises and to prevent an unevenness of the leakage current of the memory cells due to an uneven heat generation, so that the operational margin of the sense amplifiers can be enlarged. It is possible to prevent the constant voltage or the reference of the internal voltage drop from fluctuating under the influences of the coupling from another signal line. Thus, the signal delay from the input pads to the internal circuit can be shortened by an initial stage circuit and a drive circuit, which are disposed in the vicinity of the input pads. In order to achieve the above-specified effects, a plurality of internal voltage drop circuits are provided in the semiconductor memory circuit in accordance with the present invention. These internal voltage drop circuits are provided in one-to-one relation to the individual memory blocks, for example.

DESCRIPTION OF THE PREFERRED EMBODIMENTS

Figure 6:
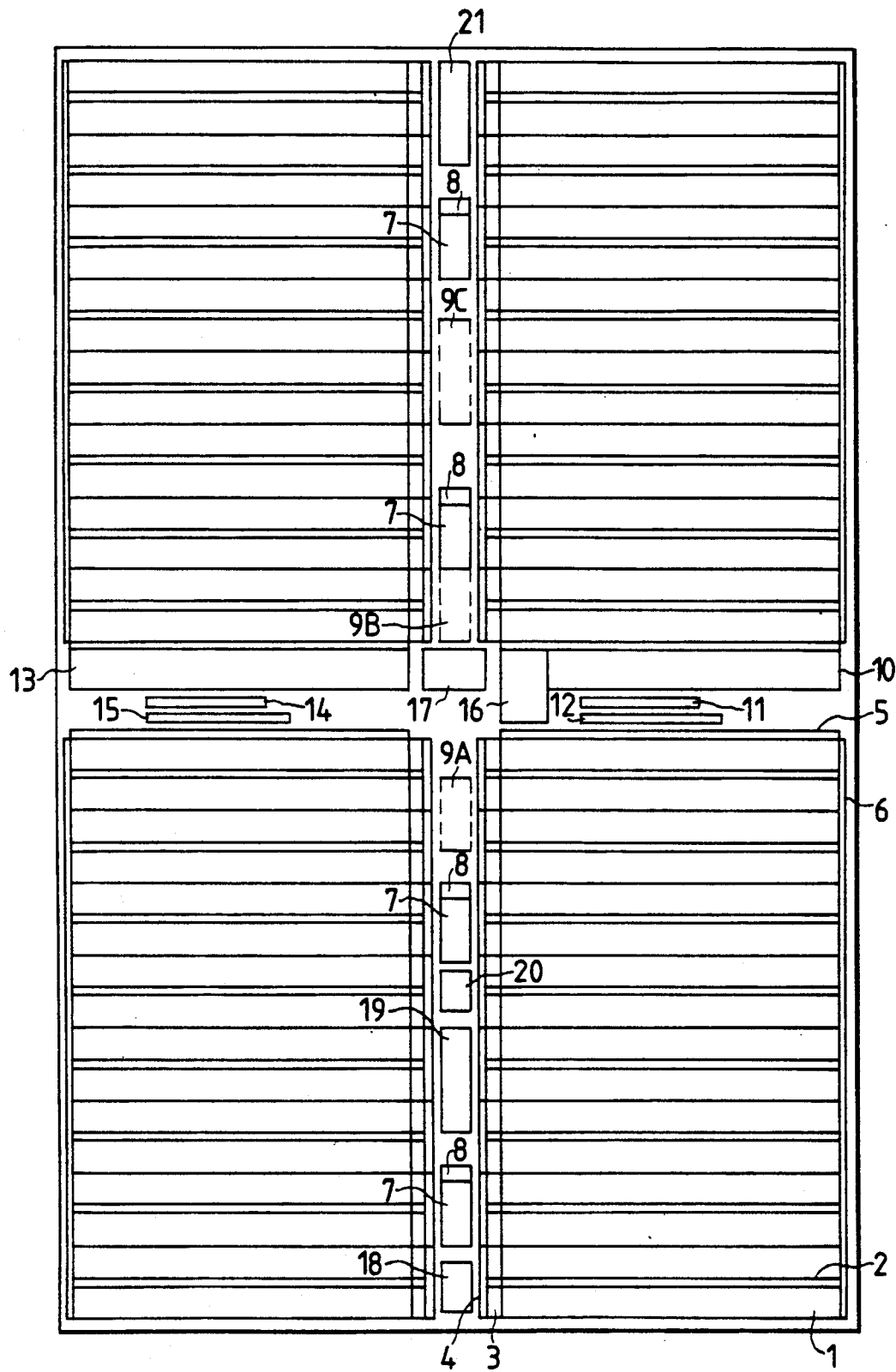
FIG. 6 is a block diagram showing one embodiment of a dynamic RAM according to the present invention.

FIG. 6 is a block diagram showing one embodiment of a dynamic RAM according to the present invention. The individual circuit blocks of the same Figure are formed over one semiconductor substrate of single crystal silicon by the well-known semiconductor integrated circuit manufacturing technology. The individual circuit blocks in the same Figure are drawn according to a geometric arrangement in an actual semiconductor chip. In the following description, the word MOSFET is used to mean an insulated gate field effect transistor (IGFET).

In order to prevent the operating speed from being lowered by elongating the lengths of various wiring lines for control signals or memory array drive signals as the chip size is enlarged for higher memory capacity, the following devices are made in this embodiment for the arrangements of a memory array unit constituting the RAM and a peripheral portion for address selections.

In the same Figure, there is provided a cross area which is formed of a longitudinal central portion and a transverse central portion of the chip. The cross area is arranged mainly with peripheral circuits, and the areas quartered by the cross area are arranged with memory arrays. In other words, the longitudinal and transverse central portion of the chip is formed with the cross-shaped area, and the four areas quartered thereby are formed with memory arrays. Each of these four memory arrays is given a memory capacity of about 4 Mbits, although not especially limitative thereto. Accordingly, the four memory arrays are given a high memory capacity of about 16 Mbits as a whole. One memory mat 1 is arranged with word lines extending transversely and paired parallel complementary data lines or bit lines extending longitudinally. A pair of memory mats 1 are transversely arranged across a sense amplifier 2. This sense amplifier 2 is shared between the paired memory mats 1 arranged transversely so that the so-called "shared sense amplifier system" is constituted. The aforementioned quartered memory arrays are individually equipped with Y-selectors 5 at their central sides. From each of these Y-selectors 5, there extend over the plurality of memory mats of the corresponding memory array Y-selecting lines for switching the gates of column switch MOSFETs of each memory mat.

At the righthand portion of the transverse central portion of the aforementioned chip, there are arranged an X-circuit 10 composed of X-address buffers, X-redundancy circuits and X-address drivers (or logical stages), a RAS control signal circuit 11, a WE control signal circuit 12 and a reference voltage generator 16. This reference voltage generator 16 is disposed close to the center of that area and is made receptive of an external supply voltage VCC such as about 5 V to generate a constant voltage VL corresponding to a voltage such as about 3.3 V to be fed to an internal circuit. At the lefthand portion of the transverse central portion of the aforementioned chip, there are arranged a Y-circuit 13 composed of Y redundancy circuits and Y-address drivers (or logical stages), a CAS control signal circuit 14 and a test circuit 15. At the central portion of the chip, there is disposed an internal voltage drop circuit 17 for generating a supply voltage VCL for a peripheral circuit such as an address buffer or a decoder.

If the redundancy circuit containing address buffers and corresponding address comparators and the CAS and RAS control signal circuits for generating control clocks are concentrated at one portion, as described above, a high integration can be achieved, for example, by separating the clock generators and other circuits across a wiring channel, i.e., by sharing the wiring channel so that the signals can be transmitted at the shortest equal distance to the address drivers (or logical stages) and so on.

The RAS control circuit 11 is used to activate the X-address buffer in response to a signal RAS. The address signal thus fetched by the X-address buffer is fed to an X-redundancy circuit. In this circuit, the address signal is compared with an NG address and decided whether or not to be switched to a redundancy circuit. This decision result and the aforementioned address signal are fed to an X-predecoder. In this X-predecoder, a predecode signal is produced and fed to individual X-decoders 3, which are provided to correspond to the aforementioned memory mats, through X-address drivers which are provided to correspond to the individual memory arrays. On the other hand, the internal signals of the aforementioned RAS system are fed to the WE control circuit and the CAS control circuit. For example, the input sequence of the RAS signal, the CAS signal and the WE signal is decided to discriminate an automatic refresh mode (CBR), a test mode (WCBR) and so on. In the test mode, the test circuit 15 is activated to set a test function in accordance with a specific address signal fed at that time.

The CAS control circuit 14 is used to provide a variety of Y-control signals in response to the signal CAS. The address signal fetched by the Y-address buffer in synchronism with the change of the signal CAS to a low level is fed to a Y-redundancy circuit. In this circuit, the address signal is compared with a stored NG address to decide whether or not to be switched to a redundancy circuit. This decision result and the aforementioned address signal are fed to a Y-predecoder, in which a predecode signal is produced. This predecode signal is fed to individual Y-decoders through Y-address drivers which are provided to correspond to the individual four memory arrays. In response to the RAS signal and the WE signal, on the other hand, the aforementioned CAS control circuit 14 decides the test mode from the decision of their input sequence, as described above, to activate the adjacent test circuit 15.

The upper portion of the longitudinal central portion of the aforementioned chip is arranged with totally sixteen memory mats and eight sense amplifiers, which are symmetric with respect to the center axis of the area. Of these, four sets of right and left memory mats and sense amplifiers correspond to four main amplifiers 7. In addition, the longitudinal central upper portion is arranged with a voltage boost generator 21 for selecting the word lines in response to an internal drop voltage and input pad areas 9B and 9C corresponding to input signals such as the address signals or the control signals. An internal voltage drop circuit 8 for generating an operating voltage for the sense amplifier 2 in a manner to correspond to the four sets of right and left memory blocks.

In this embodiment, one block is arranged with eight memory mats 1 and four sense amplifiers 4 so that the totally sixteen memory mats 1 and eight sense amplifiers 2 are assigned symmetrically with respect to the longitudinal axis. According to this structure, the amplified signals from the individual sense amplifiers 2 can be transmitted through short signal propagation paths to the few or four main amplifiers 7.

The lower portion of the longitudinal central portion of the aforementioned chip is also arranged with totally sixteen memory mats and eight sense amplifiers which are symmetrical with respect to the center axis of the area. Of these, four sets of right and left memory mats and sense amplifiers correspond to the four main amplifiers 7. In addition, the longitudinal central lower portion is arranged with a substrate voltage generator 18 for generating a negative bias voltage to be fed to the substrate in response to the internal drop voltage, an input pad area 9A corresponding to input signals such as the address signals or the control signals, a data output buffer circuit 19 and a data input buffer circuit 20. Likewise, four sets of right and left memory blocks correspond to the internal voltage drop circuit 8 for generating the operating voltage of the sense amplifier 2. As a result, the amplified signals from the individual sense amplifiers 2 can also be transmitted through short signal propagation paths to the few or four main amplifiers 7.

Although omitted from the same Figure, the aforementioned longitudinal central region is arranged with a variety of bonding pads in addition to the aforementioned areas 9A to 9C. These bonding pads are exemplified by external power supply pads, and as many as totally ten and several pads for supplying the ground potential of the circuit are generally aligned to increase the level margin of the input, i.e., to drop the supply impedance. These ground potential pads are connected with the ground potential leads which are formed by the LOG technique to extend in the longitudinal direction. Of those ground potential pads, the pads for clearing the word lines and for preventing the unselected word lines of the word driver from floating due to a coupling and the pads for the common sources of the sense amplifiers are provided mainly for dropping the supply impedance. As a result, the ground potential of the circuit has its supply impedance dropped for the operation of the internal circuit, and the ground wiring of the internal circuits of the aforementioned several kinds is connected by a low-pass filter made of the LOG lead frame and the bonding wires, so that the generation of noises can be minimized together with the propagation of noises of the ground lines between the internal circuits.

In this embodiment, the pads corresponding to the external supply voltage VCC such as about 5 V are individually provided to correspond to the internal voltage drop circuits 8 and 17 for the aforementioned voltage transformations. These provisions are intended for suppressing the noise propagations of the voltages (VCC, VDL and VCC) between the internal circuits.

Address inputting pads A0 to A11 and control signal pads RAS, CAS, WE and OE are arranged in the aforementioned areas 9A to 9C. In addition, there are provided the data inputting and outputting pads, the bonding master pads, the monitoring pads and the following pads for controlling the monitoring pads. The bonding master pads are used for designating a static column mode and for assigning a nibble mode and a write mask function at the time of constituting ×4 bits. The monitoring pads are used for monitoring the internal voltages VCL, VDL, VL, VBB, VCH and VPL. Of these, the internal voltage VCL is a peripheral circuit supply voltage of about 3.3 V and is commonly generated by the internal voltage drop circuits 17. The internal voltage VDL is a supply voltage of about 3.3 V to be fed to the memory arrays, i.e., the aforementioned four memory blocks and is generated for each of the aforementioned four memory blocks. The internal voltage VCH is a word line selection level, which is boosted to about 5.3 V in response to the aforementioned internal voltage VDL, that is, a boost supply voltage for selecting the shared switch MOSFETs. The internal voltage VBB is a substrate back-bias voltage at −2 V or the like, and the internal voltage VPL is a plate voltage of the memory cells. The internal voltage VL is a constant voltage of bout 3.3 V to be fed to the internal voltage drop circuits 8 and 17.

Figure 1:
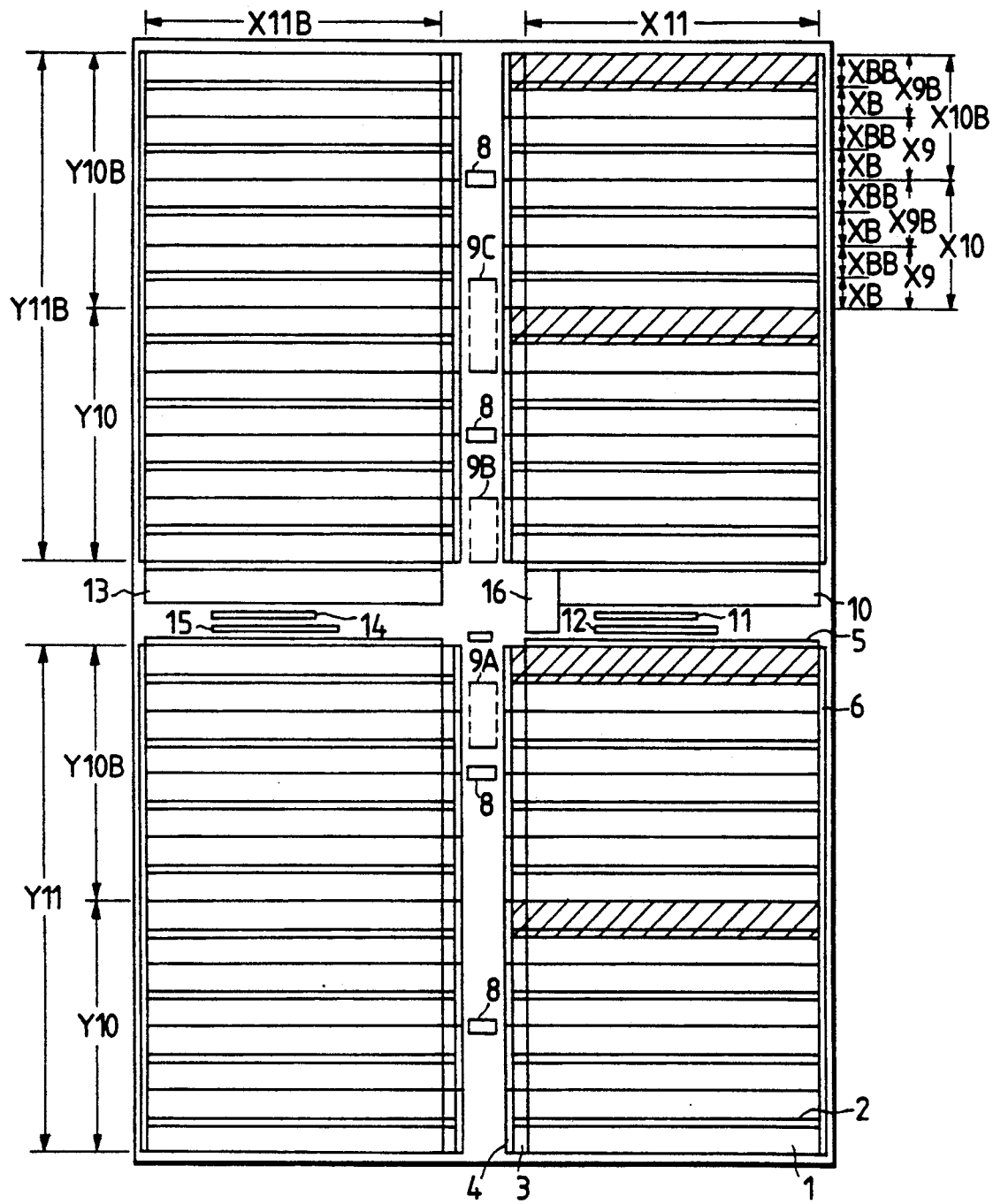
FIG. 1 is a block diagram showing one embodiment of address assignments In a RAM according to the present invention.

FIG. 1 is a block diagram showing the address assignment of one embodiment in the aforementioned RAM according to the present invention.

The RAM of this embodiment has the memory capacity of about 16 Mbits, as has been described hereinbefore. Moreover, the address signals take the address multiplex system, in which the X-address signals and the Y-address signals are fed in time series in synchronism with the address strobe signals RAS and CAS. Thus, the X-address signals are composed of X0 to X11 of 12 bits, and the Y-address signals are composed of Y0 to Y11 of 12 bits. In the same Figure, the address signals X0 to X11 are true signals indicating the selection state if the address signals fed from the outside are at the high level, and the address signals X0B to X11B are bar signals indicating the selection state if the address signals fed from the outside are at the low level. Likewise, the address signals Y0 to Y11 are true signals indicating the selection state if the address signals fed from the outside are at the high level, and the address signals Y0B to Y11B are bar signals indicating the selection state if the address signals fed from the outside are at the low level.

The paired memory mats 1 are arranged transversely (or vertically, as shown in the same Figure) across the sense amplifiers 2. The corresponding X-decoders, word line drivers 3 and mat control signal generators 4 constitute the minimum unit memory circuit. The RAM of this embodiment is quartered in the longitudinal direction of the chip to form four memory blocks. One memory block is equipped with four sets of totally eight unit memory circuits which are arranged transversely across the aforementioned longitudinal central portion. The memory blocks thus described are designated by the address signals Y10 and Y11 of the more significant 2 bits of the Y-system. Specifically, the chip has its top and bottom designated by the address signals Y11 and Y11B of the most significant bit and its half designated by the address signals Y10 and Y10B of the next bit. Thus, the four memory arrays are quartered in the longitudinal direction of the chip.

The memory blocks thus quartered as above are transversely divided by the most significant bits X11 and X11B of the X-system. These most significant bits X11 and X11B are also used as selection signals for selecting which transverse side of the memory mats the aforementioned main amplifiers 7 are to be used at. The address signals X10 and X10B, and X9 and X9B of the next significant 2 bits are used for designating the four unit memory circuits which are transversely arranged. Moreover, the address signals X8 and X8B are used as selection signals for selecting the transverse memory mats to be connected with the sense amplifiers.

In the aforementioned unit memory circuit, one memory mat has 256 word lines. This unit memory mat takes the so-called "shared sense amplifier system", in which complementary data lines (e.g., bit lines or digit lines) are arranged transversely across the sense amplifiers, so that memory cells corresponding to 512 word lines are substantially assigned to one sense amplifier. These right and left address designating signals to be used are exemplified by the aforementioned address signals X8 and X8B. Hence, the X-decoder circuit 3 has a function to decode the address signals X0 to X8 of 9 bits thereby to select one word line.

If an X-address signal is fetched in synchronism with the row-address strobe signal RAS, the selection of the X-system is accomplished. At this time, according to the aforementioned address assignment, one of the right and left memory mats across the aforementioned longitudinal central area is selected from the aforementioned four memory blocks in response to the address signals X11 and X11B. Moreover, one memory mat is assigned in response to the address signals X10 and X10B to X8 and X8B so that a word line selection of 1/256 is accomplished in response to the address signals X0 to X7 of 8 bits.

By the selections of the X-system thus far described, one word line is selected in each memory block. In other words, one memory mat and one sense amplifier, as hatched in the same Figure, are operated in each memory block. In a manner to correspond to the word line selections and the sense amplifier dispersions, each memory block is equipped with the internal voltage drop circuit 8 for generating the selections and dispersions. Thanks to the memory block divisions, the corresponding word line selections and the sense amplifier activations, it is possible to prevent a high current from being concentrated at a specific wiring and accordingly the noises at a relatively high level from being caused. In accordance with such current dispersions, it is possible to prevent a heat generation at a specific portion of the chip. The temperature rise of the chip due to the current concentration will invite an unevenness of the leakage current of the memory cells so that a refresh period has to be set for the memory cell of the worst case. As in this embodiment, the aforementioned current dispersions can be achieved by the combination of the sense amplifiers 1 and the corresponding internal voltage drop circuits 8 so that the chip temperature rise can be uniformized to improve the data storing characteristics of the memory cells. In other words, the refresh period can be elongated.

Incidentally, the Y-decoder 5 provided for each memory array decodes the Y-address signals Y2 to Y9 to select the complementary data lines of the memory mat. In other words, the aforementioned address signals Y2 to Y9 of 8 bits are decoded to accomplish the address selections of 1/256. Nevertheless, the column selector selects the complementary data lines at a unit of 4 bits. Therefore, the unit memory circuit has a memory capacity of $512 \times 256 \times 4$, and either one of the memory arrays divided by the cross area or one of the memory blocks divided by the aforementioned address assignment is equipped with eight unit memory circuits so that all the memory arrays or memory blocks have a memory capacity of $512 \times 256 \times 4 \times 8 = 4,194,304$ bits, i.e., about 4 Mbits. As a result, the whole DRAM has a high memory capacity of about 16 Mbits because it is constructed of four memory arrays ( or memory blocks).

One of the four main amplifiers is selected in response to the address signals Y0 and Y1 of the Y-address signals. Moreover, the aforementioned memory block selection is accomplished, that is, one of four sets of main amplifiers 7 is selected in response to the remaining address signals Y10 and Y11. Thus, one of the totally sixteen main amplifiers is activated in response to the aforementioned address signals Y0 and Y1, and Y10 and Y11 of 4 bits so that a read signal of 1 bit is outputted through the data output circuit 19.

Incidentally, in case of a memory access at a unit of 4 bits, the address signals Y10 and Y11 are invalidated, although not especially limitative thereto, and the signals of the totally four main amplifiers of the four sets, as designated by the address signals Y0 and Y1, may be outputted in parallel. In the reading operation in the nibble mode, moreover, the aforementioned main amplifiers are enabled to output 4 bits in serial by incrementing the address signals Y0 and Y1 or Y10 and Y11, although not especially limitative thereto.

Figure 2:
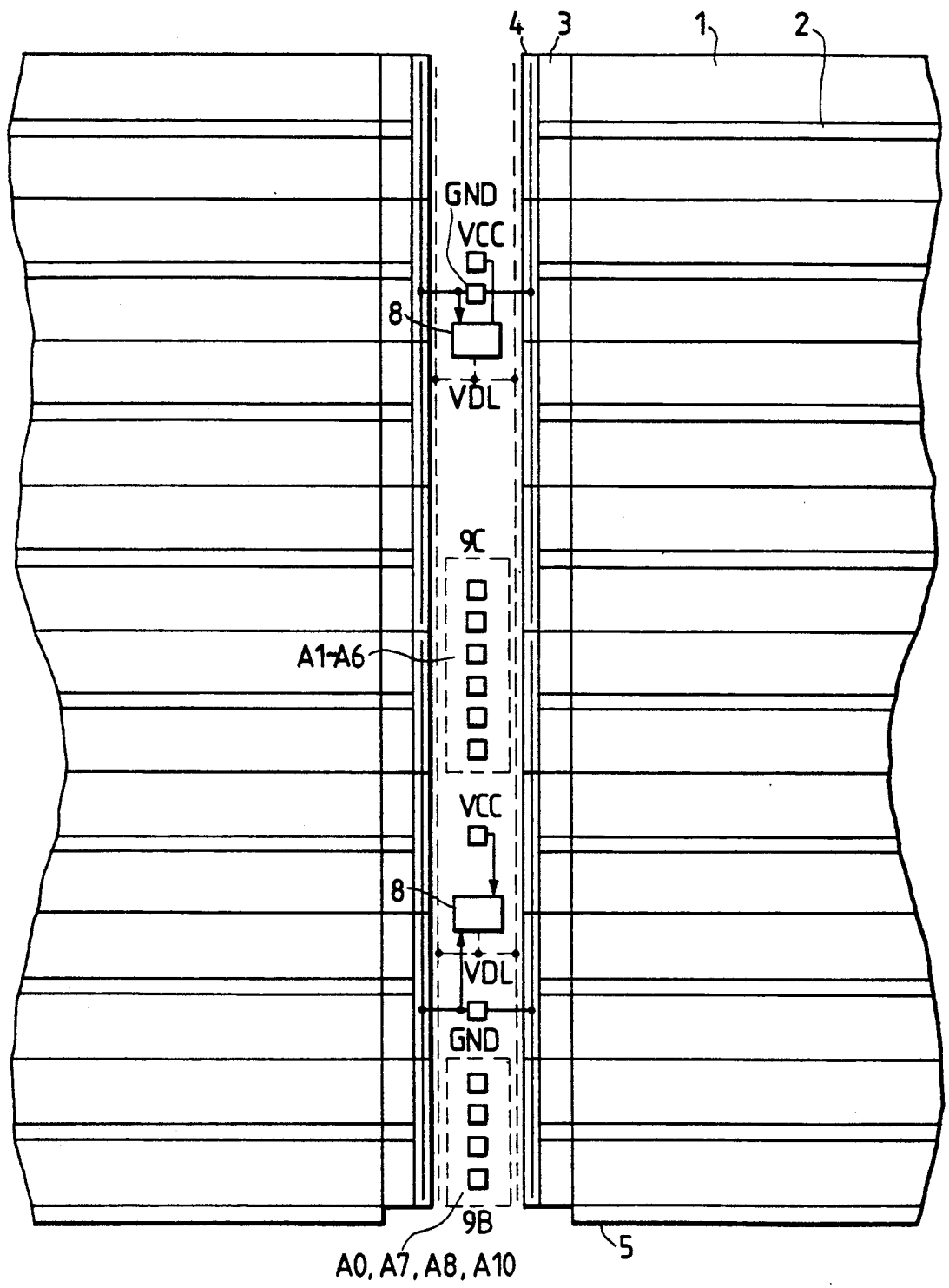
FIG. 2 is a schematic layout diagram for explaining one embodiment of both supply wiring lines for an internal voltage drop circuit 8 to each sense amplifier and associated pads.

FIG. 2 is a schematic layout diagram for explaining one embodiment of a supply wiring for each sense amplifier from the internal voltage drop circuit 8 and a related pad specifically. The same Figure exemplifies a representative example of the upper half of the semiconductor chip in the aforementioned block diagram of FIGS. 1 or 6.

The letters VCC designate pads for the external power supply to supply the operating voltage directly to the internal voltage drop circuit 8 through the wiring layer. Letters GND designate ground potential pads, from which a wiring layer is extended transversely of the internal voltage drop circuit 8 and branched vertically as a group wiring to the sources of N-channel type switch MOSFETs for activating every four sense amplifiers 2 disposed in the unit memory circuits of the four circuit blocks 1 to 4. The internal voltage drop circuit 8 is made receptive of the operating voltages fed from the aforementioned pads VCC and GND to generate the internal drop voltage VDL of about 3.3 V in response to the later-described constant voltage VL. The voltage VDL is transversely extended to correspond to the aforementioned ground lines and branched vertically, as indicated by broken lines in the same Figure, as the supply voltage to be fed to the sources of the P-channel switch MOSFETs for activating every four sense amplifiers 2 disposed in the four unit memory circuits.

Incidentally, the same Figure exemplifies the address signal pads A1 to A6 and A0, A7, A8 and A10 disposed in the areas 9C and 9B in addition to the aforementioned supply pads.

Figure 5:
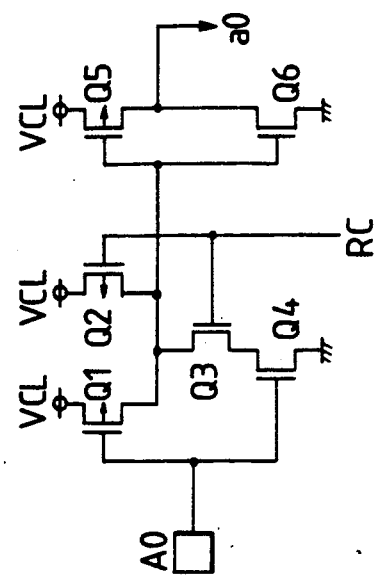
FIG. 5 is a circuit diagram showing one embodiment of an initial stage circuit and a drive circuit corresponding to the input pads.

FIG. 5 is a circuit diagram showing one embodiment of an initial stage circuit corresponding to an input signal such as the aforementioned address signal A0.

An input stage circuit corresponding to the input pad A0 is constructed of a NAND gate circuit having a CMOS structure. Specifically, the two-input NAND gate circuit is composed of P-channel MOSFETs Q1 and Q2 in parallel mode and N-channel MOSFETs Q3 and Q4. The one input of the NAND gate circuit, i.e., the shared gate of the P-channel MOSFET Q1 and the N-channel MOSFET Q4 is connected with the aforementioned input pad A0. The other input, i.e., the shared gate of the P-channel MOSFET Q2 and the N-channel MOSFET Q3 is fed with an activation signal such as an address strobe signal RC. This input stage NAND circuit is disposed in the vicinity of the corresponding input pad A0. This input stage circuit has its operation voltage set to the supply voltage VCL generated internally and has a level transforming function to change the CMOS level or TTL level of 5 V inputted from the outside into a CMOS level corresponding to the aforementioned internal drop voltage (VCL) such as about 3.3 V, although not especially limitative thereto.

In case the initial stage circuit is provided to correspond to the input pad A0 or the like, as in this embodiment, the signal transmission is accomplished with a relatively large wiring length from the initial stage circuit to the central portion of the chip. There exist relatively high wiring resistance and parasitic capacitance. Thus, the initial stage gate has its output portion provided with a drive circuit. This drive circuit is constructed of a CMOS inverter circuit composed of a P-channel type MOSFET Q5 and an N-channel MOSFET Q6 and has an internal drop voltage VCL of about 3.3 V if the input stage gate has the level transforming function, as above. Thanks to the provision of such drive circuit, the signal having its level transformed by the initial stage circuit close to the aforementioned input pad A0 can be promptly transmitted to a substantial address buffers of the RAS system and the CAS system, which are at a relatively long distance therefrom.

Such initial stage gate circuit and drive circuit are likewise provided for the input pads for the other address signals A1 to A11 and the control signals such as RAS, CAS and WE.

Incidentally, the external signals such as the control signals RAS or CAS are inputted as they are, and the initial stage circuit to be used is exemplified by not the aforementioned NAND gate but a mere inverter circuit. For the address input pads, on the other hand, the inverter circuit may be the initial stage circuit having the level transforming function only so that the output portion may be equipped with a gate circuit corresponding to the address strobe signals. Moreover, this gate circuit may be given a signal line driving function as in the aforementioned drive circuit. In FIG. 5, moreover, the drive circuit may have its operating voltage set to VCC to perform the level transforming operation.

Figure 3:
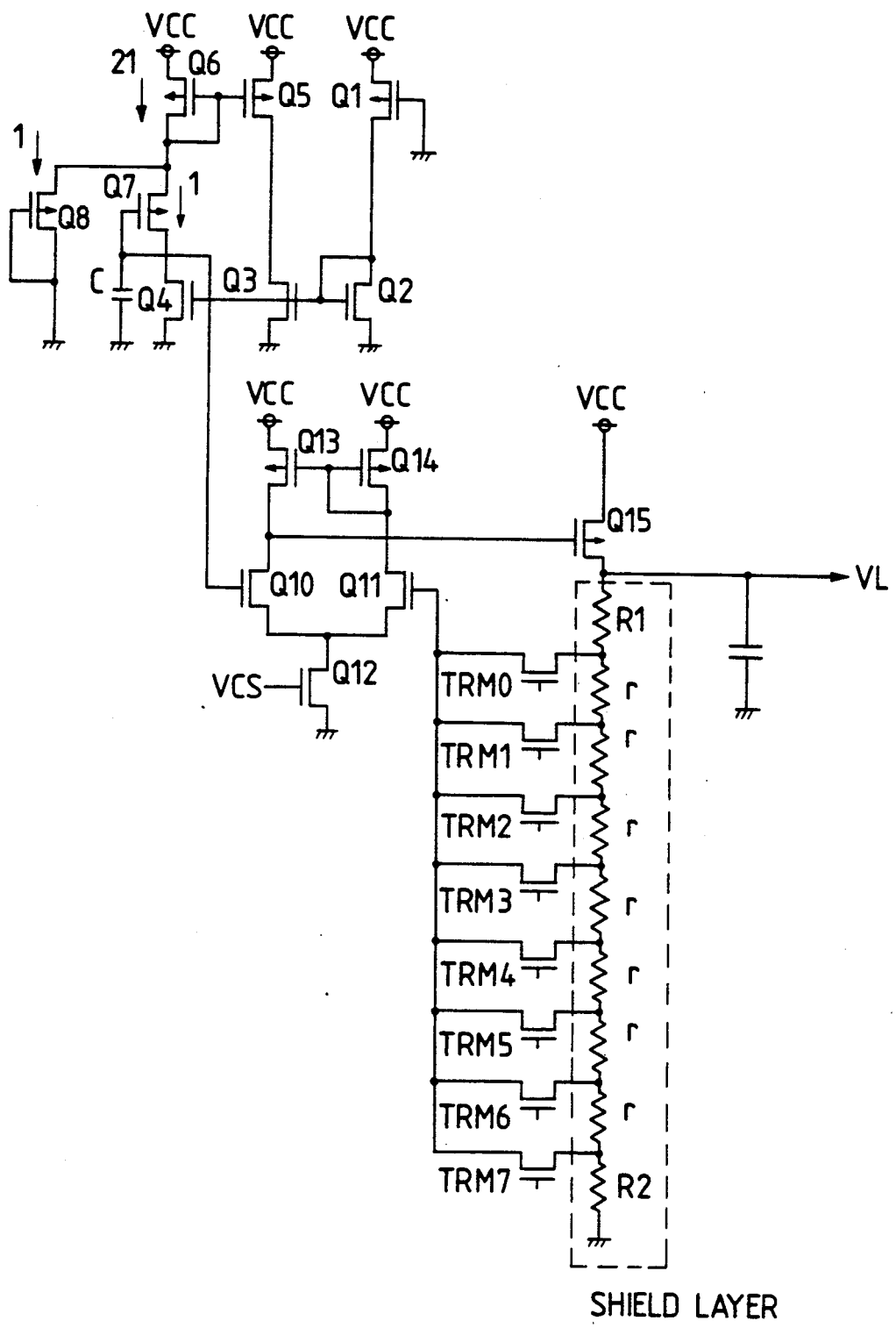
FIG. 3 is a circuit diagram showing one embodiment of a reference voltage generator according to the present invention.

FIG. 3 is a circuit diagram showing one embodiment of the reference voltage generator 16.

The circuit symbols attached to the circuit elements of the same Figure are partially common to those of FIG. 5 but should be understood to have individually different circuit functions.

A constant current is established by feeding the ground potential to the gate of the P-channel MOSFET Q1. This constant current is fed to the N-channel MOSFET Q2 in a diode mode. This MOSFET Q2 is equipped in a current mirror mode with N-channel MOSFETs Q3 and Q4. The MOSFET Q3 has its constant drain current transformed into an extrusion current by a current mirror circuit which is composed of P-channel MOSFETs Q5 and Q6. At this time, the constant extrusion current is set to 2i whereas the constant suction current of the MOSFET Q4 is set to i, by setting the sizes of the MOSFETs Q3 and Q4 or Q5 and Q6.

Between the aforementioned MOSFET Q4 and the P-channel MOSFET Q6, there is connected in a series mode a P-channel MOSFET Q7 in a diode mode. Between the node of the aforementioned MOSFETs Q6 and Q7 and the ground potential point of the circuit, there is connected a P-channel MOSFET Q8 in a diode mode. Thus, the constant current i is caused to flow through the two P-channel MOSFETs Q7 and Q8 in a diode mode.

The MOSFET Q8 has its threshold voltage raised according to its dose by having its channel region doped with a P-type impurity by the ion implantation. Since the two MOSFETs Q7 and Q8 are fed with the equal constant current i while retaining a difference between their threshold voltages, the MOSFET Q7 has its source establishing a reference voltage which corresponds to the difference ($V_{th8}-V_{th7}$) of the threshold voltages $V_{th8}$ and $V_{th7}$ of the two MOSFETs Q8 and Q7. The aforementioned difference ($V_{th8}-V_{th7}$) can be accurately set to about 1.1 V by the ion implantation technique.

This reference voltage is transformed into the constant voltage VL such as about 3.3 V by the following DC amplifier. A load circuit composed of P-channel MOSFETs Q13 and Q14 in a current mirror mode, N-channel MOSFETs Q10 and Q11 in a differential mode, and a constant current MOSFET Q12 for establishing the operation current constitute altogether a differential amplifier. This differential amplifier is equipped with an output P-channel type MOSFET Q15. Moreover, this output MOSFET Q15 has its output signal divided by feedback resistors R1 and R2 and fed back negatively to the differential amplifier. At this time, in order to set the constant voltage VL accurately to 3.3 V, a trimming resistor r for fine adjustment is connected in series between the feedback resistors R1 and R2. Between their individual nodes and the feedback input of the differential amplifier, there are connected trimming switch MOSFETs TRM0 to TRM7. These switch MOSFETs TRM0 to TRM7 have their gates switched by cutting fuse means, although not especially limitative thereto.

For example, the intermediate switch MOSFET TRM3 is turned on. If the constant voltage VL at this time exceeds a target voltage of 3.3 V, the upper switch MOSFET TRM2 is turned on to raise the feedback voltage and decrease the gain thereby to drop the constant output voltage VL. If the switch MOSFETs Q1 and Q0 are then turned on, the constant output voltage VL can be accordingly dropped. If, on the contrary, the constant voltage VL at the time of turning on the intermediate switch MOSFET TRM3 is lower than the target voltage of 3.3 V, the upper switch MOSFET TRM4 is turned on to drop the feedback voltage and increase the gain thereby to raise the constant output voltage VL. If the switch MOSFETs Q5 to Q7 are then turned on, the constant output voltage VL can be accordingly raised.

In order to reduce the power consumption of the RAM, the composed resistance of the series circuit of the aforementioned feedback resistors R1 and R2 is set at a high value. In other words, the resistance is set at a sufficient high level so as to reduce the DC current through the aforementioned series resistance circuit. Thus, the coupling is liable to exert influences. The reference voltage generator 16 is arranged at the central portion of the chip because it feeds the reference voltage VL to the plurality of internal voltage drop circuits 8 and 17, as has been described hereinbefore. The central portion of the chip is the place where the longitudinal signal lines and the transverse signal lines are densely collected. In order to give the aforementioned high resistance, on the other hand, the series resistance circuit R1, r and R2 occupies a relatively wide area. This makes it necessary to form a wiring channel over the DC resistance circuit. However, there arises a problem that the constant voltage VL is fluctuated by the influences of the aforementioned coupling.

In this embodiment, therefore, the resistance circuit is equipped with a shield layer, as indicated by dotted lines in the same Figure. Thanks to this shield layer, the signal line can be arranged over the the aforementioned high resistance element.

Figure 4:
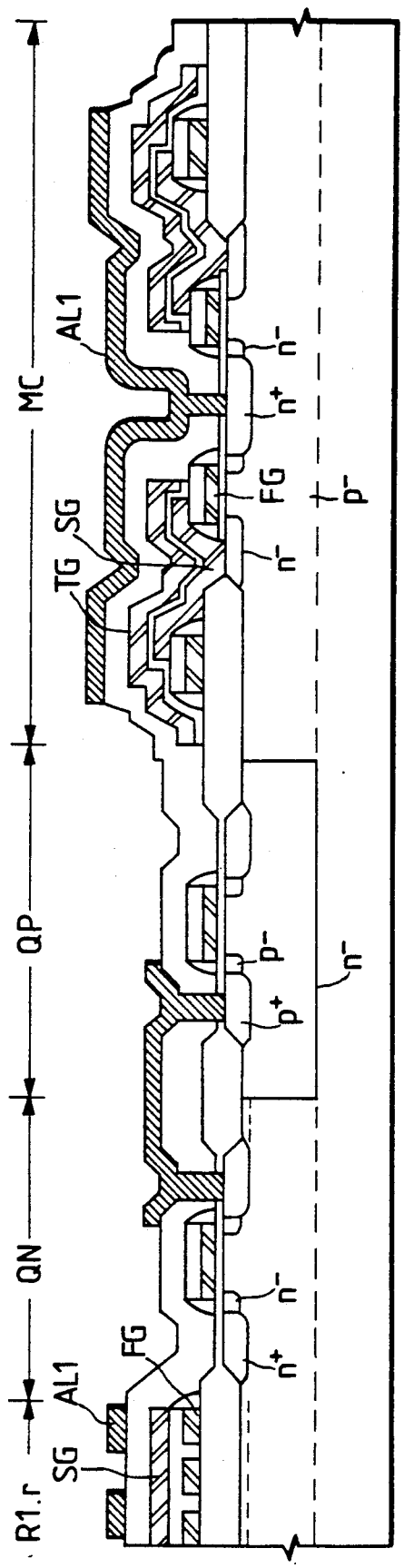
FIG. 4 is a section showing an essential element section of one embodiment of the RAM including resistance elements to be used in the reference voltage generator.

FIG. 4 is a section showing an essential element structure of one embodiment of the RAM containing the aforementioned resistance element. In the same Figure, in addition to the aforementioned resistors R1 and r, there are formed at the righthand side an N-channel MOSFET designated at QN, a P-channel MOSFET designated at QP, and a memory cell designated at MC.

The memory cell MC is constructed to have the so-called "STC structure", in which an address selecting MOSFET has its gate made of first-layered poly-silicon FG and in which a data storing capacitor has its two electrodes made of second-layered poly-silicon SG and third-layered poly-silicon TG. In this embodiment, the resistors R1 and r are made of the first-layered poly-silicon FG formed over the field insulating film and are overlaid through an inter-layer insulating film by a shield layer made of the second-layered poly-silicon SG, although not especially limited thereto. This shield layer is given either the ground potential of the circuit or an AC ground potential such as the supply voltage VCL, although not especially limitative thereto. The shield layer is overlaid through an inter-layer insulating film by a signal line made of aluminum AL1 or the like.

Incidentally, the RAM using two aluminum layers may have its first-layered aluminum layer AL1 used as a longitudinal wiring channel and its second-layered aluminum layer AL2 used as a transverse channel layer.

Moreover, the shield layer may be made of the third-layered poly-silicon TG or the first-layered aluminum layer AL1 if only the second-layered aluminum layer AL2 is used as a wiring layer.

The operational effects to be obtained from the foregoing embodiments are as follows;

(1) The semiconductor integrated circuit device is divided into a plurality of memory blocks, each of which has its X-system addresses assigned so that an equal number of word lines of a plurality of memory mats and sense amplifiers may be selected, and a plurality of internal voltage drop circuits are provided for generating the operating voltages of the sense amplifiers in response to a supply voltage from the outside in a one-to-one relation to each memory block or for a plurality of memory blocks, so that a high current can be prevented from flowing into a specific wiring. As a result, there can be attained effects of reducing the supply noises and preventing an unevenness of the leakage current of the memory cells due to an uneven heat generation, so that the operational margin of the sense amplifiers can be enlarged.

(2) Thanks to the aforementioned effect (1), the refresh period can be elongated by averaging the leakage current of the memory cells, thus creating an effect of reducing the power consumption.

(3) The shield layer is formed over the feedback resistance circuit in the feedback amplifier for generating the constant voltage by amplifying a voltage in response to the reference voltage in accordance with the resistance ratio of the resistance elements composing the feedback circuit and is overlaid by the signal wiring channel, thus creating an effect of stabilizing the constant voltage and significantly densening the wiring channel.

(4) In the vicinity of the input pads, there are disposed the initial stage circuit and the drive circuits for driving the signal lines for guiding the signals corresponding to the input signals fed from the input pads into the internal circuit, thus creating an effect of shortening the signal delay from the input pads to the internal circuit.

Although our invention has been specifically described in connection with the foregoing embodiments thereof, it should not be limited to the embodiments but can naturally be modified in various manners without departing the gist thereof. In FIG. 1, for example, a plurality of word lines and corresponding sense amplifiers may be activated for one memory cell. In this case, the current over the semiconductor chip is averaged to uniform the heat generation by activating an equal number of word lines and sense amplifiers in the four memory blocks. Thus, in the structure for selecting the plurality of word lines per one memory block, it is possible to reduce the number of refresh cycles. For example, if one word line is selected in the ordinary operation for each memory block and if two word lines are simultaneously selected in the refresh mode, the number of refresh cycles can be halved from 1,024 to 512.

The overall layout of the RAM is based on the aforementioned structure shown in FIG. 6, and its peripheral circuit can be arranged in various modes of embodiment. Moreover, the structure of arranging the initial stage circuit and the drive circuit in the vicinity of the input pads, and the structure of shielding the resistance circuit for generating a constant voltage to be fed to the internal voltage drop circuit in each internal circuit block by positioning the reference voltage circuit at the center of the chip can be widely applied not only to the RAM, which is intended to have a high memory capacity as in this embodiment, but also to a variety of semiconductor integrated circuit devices composed in combination of a large-scale logical gate circuits and memory circuits. The description thus far made has been directed mainly to the case, in which our invention is applied to the large-scale DRAM providing the background technical field of the invention. Despite of this description, however, our invention should not be limited thereto but can be widely applied not only to a variety of memory circuits such as SRAM or ROM but also to a semiconductor integrated circuit device such as a large-scale logical integrated circuit.

The effects to be obtained by the representatives of the invention disclosed herein will be briefly described in the following. The semiconductor integrated circuit device is divided into a plurality of memory blocks, each of which has its X-system addresses assigned so that an equal number of word lines of a plurality of memory mats and sense amplifiers may be selected, and a plurality of internal voltage drop circuits are provided for generating the operating voltages of the sense amplifiers in response to a supply voltage from the outside in a one-to-one relation to each memory block, so that a high current can be prevented from flowing into a specific wiring. As a result, it is possible to reduce the supply noises, to improve the electro-immigration characteristics, and to prevent an unevenness of the leakage current of the memory cells due to an uneven heat generation, so that the operational margin of the sense amplifiers can be enlarged. The shield layer is formed over the feedback resistance circuit in the feedback amplifier for generating the constant voltage by amplifying a voltage in response to the reference voltage in accordance with the resistance ratio of the resistance elements composing the feedback circuit and is overlaid by the signal wiring channel. Thus, it is possible to stabilize the constant voltage and to significantly densen the wiring channel. In the vicinity of the input pads, there are disposed the initial stage circuit and the drive circuits for driving the signal lines for guiding the signals corresponding to the input signals fed from the input pads into the internal circuit. Thus, it is possible to shorten the signal delay from the input pads to the internal circuit.

Reference is made to copending our U.S. application of Ser. No. 424,904, filed on Oct. 18, 1989, the subject matter of which is incorporated herein by reference.

What is claimed is:

1. A semiconductor integrated circuit device comprising:
   a plurality of divided memory blocks, each of which includes a plurality of sets of memory mats arranged with dynamic memory cells in a matrix shape and sense amplifiers for amplifying signals read out of said memory mats;
   a plurality of internal voltage drop circuits, each of which is coupled to receive a supply voltage from outside of the semiconductor integrated circuit device for generating operating voltages of said sense amplifiers; and a plurality of pads, each of which respectively corresponds to a predetermined one of said internal voltage drop circuits, for respectively coupling said plurality of internal voltage drop circuits to said supply voltage.

2. A semiconductor integrated circuit device according to claim 1, wherein an equal number of word lines is selected in each of said memory blocks.

3. A semiconductor integrated circuit device according to claim 1, wherein said plurality of pads includes a first group of pads that are coupled to a positive potential of said supply voltage and a second group of pads that are coupled to a negative potential of said supply voltage, wherein each of said plurality of internal voltage drop circuits is respectively coupled to a predetermined pad of said first group of pads and a predetermined pad of said second group of pads.

4. A semiconductor integrated circuit device according to claim 1, wherein each of said pads is coupled to only one of the internal voltage drop circuits to minimize current flow on wirings between said pads and said internal voltage drop circuits.

5. A semiconductor integrated circuit device according to claim 3, wherein each of said pads is coupled to only one of the internal voltage drop circuits to minimize current flow on wirings between said pads and said internal voltage drop circuits.

6. A semiconductor integrated circuit device according to claim 2, further comprising: a feedback amplifier for amplifying a predetermined reference voltage in accordance with a resistance ratio of resistance elements comprising a feedback circuit thereby to generate a constant voltage; a power supply circuit in a voltage follower mode for amplifying the power of said constant voltage to generate a supply voltage necessary for the operations of said internal voltage drop circuits; and a signal wiring formed through a shield conductive layer over resistance elements comprising at least said feedback circuit.

7. A semiconductor integrated circuit device according to claim 6, wherein said resistance elements are made of a first poly-silicon layer, and wherein said shield layer is made of a second or third poly-silicon layer formed over the first poly-silicon layer.

8. A semiconductor integrated circuit device, wherein said feedback amplifier according to claim 3 is commonly disposed in a central portion of a semiconductor integrated circuit device comprising: a plurality of divided memory blocks, each of which includes a plurality sets of memory mats arranged with dynamic memory cells in a matrix shape and sense amplifiers for amplifying signals read out of said memory mats; a data memory unit having X-addresses assigned so that an equal number of word lines may be selected in each of said memory blocks; and a plurality of internal voltage drop circuits made receptive of a supply voltage from the outside for generating the operating voltages of said sense amplifiers, whereby said feedback amplifier has its constant voltage transmitted to each of said voltage drop circuits.

* * * * *